United States Patent [19]

Chiou et al.

[11] Patent Number: 5,487,355
[45] Date of Patent: Jan. 30, 1996

[54] SEMICONDUCTOR CRYSTAL GROWTH METHOD

[75] Inventors: Herng-Der Chiou, Tempe; Tien-Yu T. Lee, Phoenix, both of Ariz.

[73] Assignee: Motorola, Inc., Schaumburg, Ill.

[21] Appl. No.: 398,258

[22] Filed: Mar. 3, 1995

[51] Int. Cl.⁶ .................................................. C30B 15/20
[52] U.S. Cl. ............................. 117/13; 117/14; 117/15; 117/208
[58] Field of Search ................................. 117/13, 14, 15, 117/28, 30, 200, 201, 202, 208, 219; 250/561

[56] References Cited

U.S. PATENT DOCUMENTS

| | | | |
|---|---|---|---|
| 3,798,007 | 3/1974 | Bochman et al. | 117/30 |
| 3,958,129 | 5/1976 | Clement et al. | 117/202 |
| 4,973,518 | 11/1990 | Kida et al. | 428/364 |
| 5,126,113 | 6/1992 | Yamagishi et al. | 117/218 |
| 5,170,061 | 12/1992 | Baba | 250/561 |
| 5,176,787 | 1/1993 | Kawashima et al. | 117/14 |
| 5,240,684 | 8/1993 | Baba et al. | 117/14 |
| 5,288,363 | 2/1994 | Araki | 117/15 |

FOREIGN PATENT DOCUMENTS 0134680  3/1985  European Pat. Off. .................. 117/14

*Primary Examiner*—R. Bruce Breneman
*Assistant Examiner*—Felisa Garrett
*Attorney, Agent, or Firm*—Kevin B. Jackson

[57] ABSTRACT

A method of growing semiconductor crystals including inserting a single crystal seed (14) of a semiconductor material into a melt (12) and pulling the seed (14) at a first rate to gradually grow an elongated, single crystal first neck (15), altering the pulling rate to a second rate, slower than the first rate, to grow a shoulder (17) on the first neck (15) with a diameter greater than the first neck (15), continuing to pull at the second rate to form a second neck (18) with a diameter equal to the diameter of the shoulder (17), and altering the pulling rate to a third rate, slower than the second rate, to grow a single crystal elongated body (20) of the semiconductor material.

13 Claims, 4 Drawing Sheets

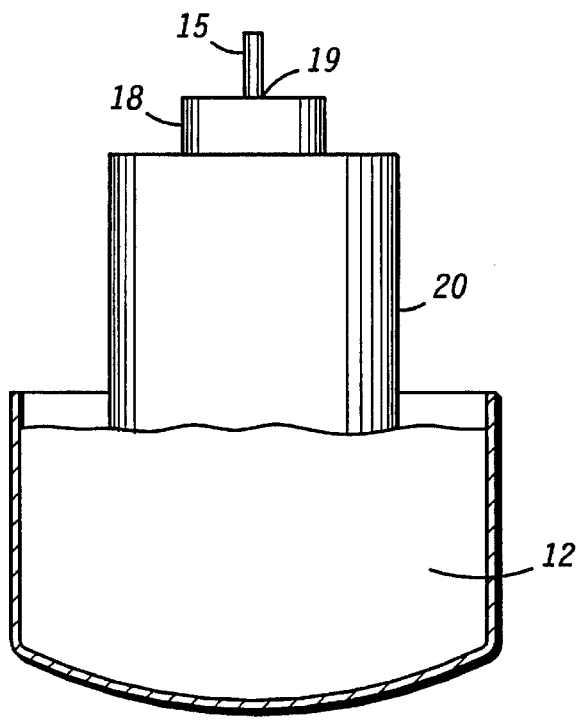
FIG. 5
FIG. 6
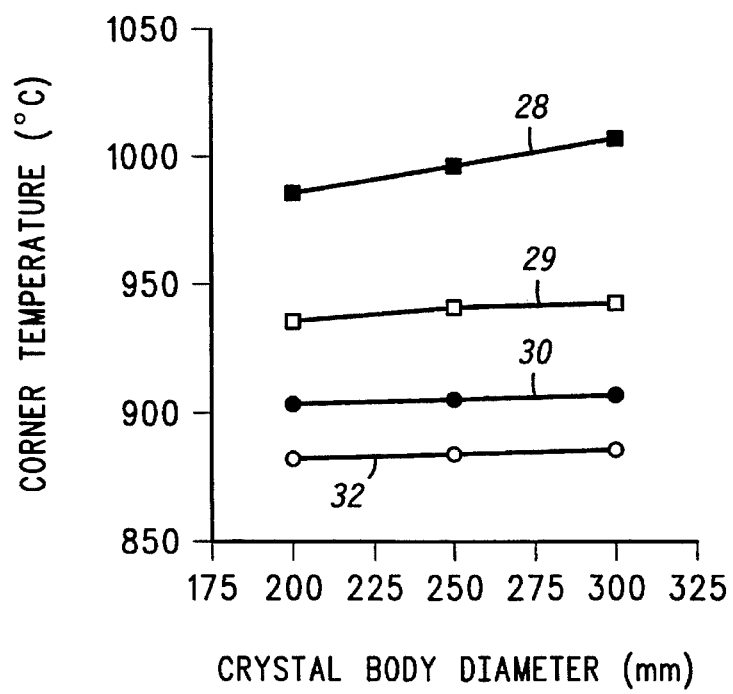

SEMICONDUCTOR CRYSTAL GROWTH METHOD

BACKGROUND OF THE INVENTION

This invention relates, in general, to growing single crystal ingots of a semiconductor material. More particularly, the present invention pertains to growing large diameter crystals.

The preferred method of producing single crystal ingots of semiconductor materials is by a technique called the Czochralski (CZ) method. Using the CZ method to grow a single crystal silicon ingot includes forming a melt of polycrystalline silicon within a crucible heated by resistance heating or high frequency heating. A single crystal seed is attached to a seed holder that is connected to an end of a pull shaft or cable and dipped into the melt of polycrystalline silicon. Subsequently, the crystal is pulled from the melt while rotating at a specified speed. The diameter of the crystal can be controlled by changing the temperature of the melt and/or by changing the rate at which the crystal is pulled from the melt. Generally, the temperature of the melt is altered by changing the power provided to the heater.

A well known problem in growing a single crystal ingot is the formation of dislocations in the single crystal ingot. This problem was overcome by beginning the crystal pull relatively quickly to form a thin neck. It is essential to the process to reduce the diameter of the seed crystal to approximately 3 to 6 millimeters (mm) to achieve a zero dislocation crystal. This seeding method is typically referred to as the Dash technique (W. C. Dash, J. Appl. Physics, Vol. 30, pp. 459–474, 1959). Once a zero dislocation crystal has been achieved, the pull speed is reduced, resulting in the growth of a larger diameter body from the thin neck. This is a conventional method for growing single crystal ingots having diameters less than 200 mm, and typically 125 to 150 mm in diameter.

Currently, the semiconductor industry is interested in larger diameter ingots. The problem is that when a large diameter single crystal ingot is being grown, the thin neck is subjected to more stress than it can structurally handle. Two stresses affect the thin neck, tensile stress from the growing weight of the ingot, and torsion stress from the rotational viscosity drag force of the solid-liquid interface. Both stresses increase with an increase in the diameter of the single crystal. If these combined stresses become larger than the yield strength of the thin neck, the thin neck may break, or more commonly, may generate dislocations in the single crystal. The yield strength of silicon single crystals reduces with increasing temperature. Therefore, when growing the large diameter crystal, the combination of stresses may exceed the yield strength at the end of the thin neck when the temperature is high.

As is readily apparent, methods for growing and structures are needed for large diameter semiconductor ingots that remedy the foregoing and other deficiencies inherent in the prior art.

BRIEF DESCRIPTION OF THE DRAWINGS

FIG. 5 is a schematic view of the ingot of FIGS. 1 and 4;

FIG. 6 is a graph illustrating junction temperature versus elongated crystal body diameter;

DETAILED DESCRIPTION OF THE DRAWINGS

Generally, the present invention relates to methods of growing large diameter semiconductor crystal ingots having reduced levels of defects. The method includes inserting a single crystal seed of a semiconductor material into a melt of the semiconductor material and forming an elongated single crystal ingot having a first neck and a second neck, the second neck having a diameter larger than the first neck.

For example, the forming step includes pulling the single crystal seed at a first pulling rate to gradually grow an elongated, single crystal first neck, altering the first pulling rate to a second pulling rate, slower than the first pulling rate, to form a first shoulder on the first neck with a diameter greater than the first neck, altering the second pulling rate to a third pulling rate faster than the second pulling rate but slower than the first pulling rate to form a second neck with a diameter approximately equal to the diameter of the first shoulder. After forming the second neck to a desired length, altering the third pulling rate to a fourth pulling rate, slower than the third pulling rate, to form a second shoulder with a diameter greater than the second neck (e.g., the desired ingot diameter), and altering the fourth pulling rate to a fifth pulling rate initially faster than the fourth pulling rate to grow a single crystal elongated body of the semiconductor material. During the growth of the first and second shoulder, the heater power also may be decreased gradually.

In addition, the present invention provides a semiconductor crystal ingot including a single crystal seed of a semiconductor material with a single crystal first neck of the semiconductor material integrally formed therewith, a second neck integrally formed with the first neck and having a greater diameter than the first neck, and a single crystal elongated body of the semiconductor material integrally formed with the second neck having a greater diameter than the second neck.

Figure 1:
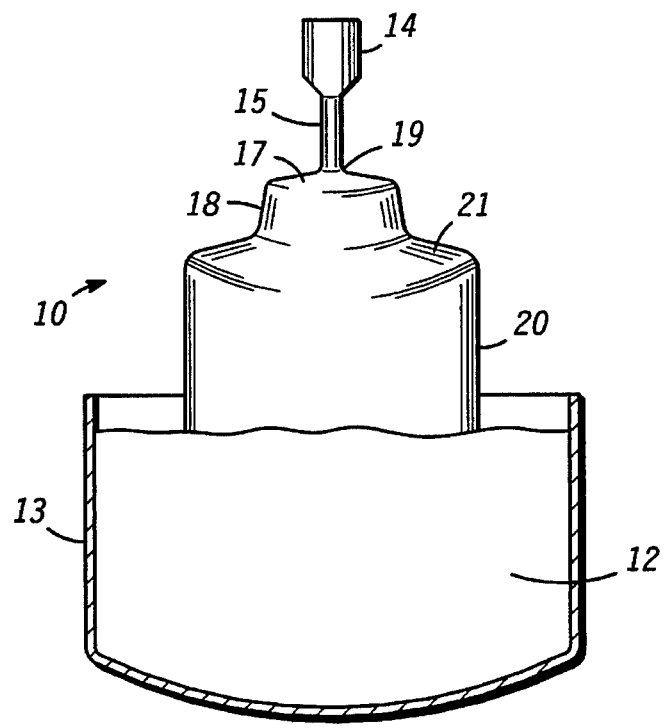
FIG. 1 is an elevational view of an ingot being formed from a melt, in accordance with the teachings of the present invention.

Turning now to the drawings in which like reference characters indicate corresponding elements throughout the several views, attention is first directed to FIG. 1, which illustrates a single crystal ingot 10 being pulled from a melt 12, employing the Czochralski method. Melt 12 is contained within crucible 13. A single crystal seed 14 of semiconductor material such as silicon is lowered into contact with melt 12 of a similar polycrystalline semiconductor material, in this case polycrystalline silicon. To remove dislocations, the Dash technique is employed. In employing the Dash technique, seed 14 is pulled from melt 12 at a first rate, resulting in a thin neck 15 extending from seed 14 and having a diameter approximately in the range of 3 mm to 6 mm. When thin neck 15 reaches a predetermined length well known in the art, the dislocations will have migrated out of the crystal.

When a dislocation free thin neck 15 of the appropriate length is formed, the pulling rate is slowed to a second rate, which is slower than the first rate to form shoulder 17 having a diameter greater than thin neck 15. Preferably, shoulder 17 will have a diameter in a range of 10 mm to 50 mm. The pulling rate is then increased to a third rate, which is faster than the second rate, to form second neck 18 with a diameter equal to the diameter of shoulder 17. Second neck 18 is formed by continuing to pull thin neck 15 and shoulder 17 at the third rate. Second neck 18 is pulled until a length in a range of 25 mm to 75 mm is achieved.

As will be discussed subsequently, a junction 19 between second neck 18 and thin neck 15 is a critical point. When the desired length of second neck 18 is achieved, the pulling rate is again altered to a fourth rate, slower than the third rate, to form second shoulder 21. Second shoulder 21 has a diameter equal to the desired diameter of the final ingot. Finally, the pulling rate is altered to a fifth rate, faster than the fourth rate to grow a single crystal elongated body 20 of the semiconductor material, from second neck 18 and second shoulder 21. It is elongated body 20 from which electronic devices are fabricated.

In a preferred embodiment, the first rate is in a range from approximately 100 to 250 mm/hour, the second rate is in a range from approximately 20 to 50 mm/hour, the third rate is in a range from approximately 50 to 125 mm/hour, and the fourth rate is in a range from approximately 15 to 50 mm/hour. When elongated body 20 is used to make 300 mm diameter wafers, the fifth rate is initially in a range from approximately 20 to 60 mm/hour. During later stages of pulling elongated body 20, the fifth rate is slowed to approximately 10 to 40 mm/hour. Preferably, during the formation of shoulders 17 and 21, the temperature of melt 12 is reduced by approximately less than a degree centigrade by adjusting the heater power supplied to melt 12.

Figure 2:
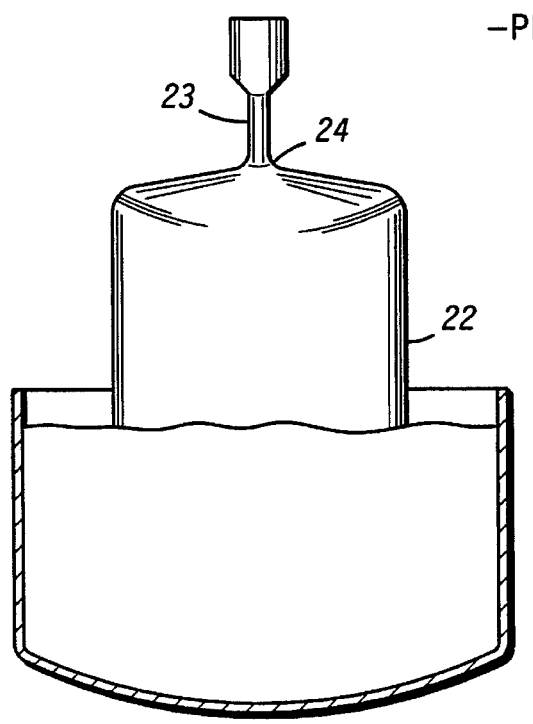
FIG. 2 is an elevational view of an ingot being formed from a melt, in accordance with conventional practice.

The above described method of forming a single crystal ingot is particularly useful in forming ingots with elongated bodies having a large diameter, generally greater than 200 mm. In conventional single crystal growth techniques as shown in FIG. 2 (Prior Art), an elongated body 22 is grown directly from a thin neck 23. This is acceptable as long as the yield strength of thin neck 23 is not exceeded. The yield strength is generally not exceeded for ingots having a diameter less than 200 mm, but will be exceeded by anything larger.

Figure 3:
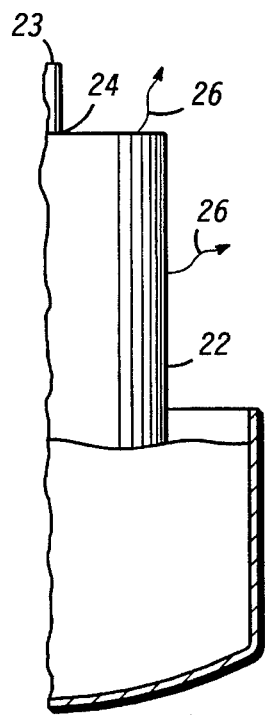
FIG. 3 is a schematic view of the heat dispersion of the ingot of FIG. 2.

A junction 24, between thin neck 23 and elongated body 22 is the point of concern. When the semiconductor material being utilized is polycrystalline silicon, the melt is at a temperature of approximately 1420 degrees Centigrade (°C.). The larger the diameter of the ingot, the more heat from the melt will be retained, and the hotter will be junction 24. This can be seen with reference to FIG. 3 (Prior Art) which illustrates elongated body 22 cooling from convection and radiated heat (represented by arrows 26). FIG. 3 shows only half of elongated body 22. As can be seen, elongated body 22 will retain a high temperature as its volume is large when compared to the surface area available for heat dissipation.

As an example (referring back to FIG. 2), during the growth of a 300 mm diameter ingot, when elongated body 22 is 100 mm long, the weight is approximately 18 Kg. If thin neck 23 is 3 mm in diameter and junction 24 between it and elongated body 22 is 1000° C. the tensile stress applied by the weight of elongated body 22 at junction 24 will be 2.55 Kg/mm² or about 25 Mpa, which exceeds 10 Mpa, the yield strength of thin neck 23 at 1000° C. Addition of the torsional stress further increases the stress on thin neck 23.

Figure 4:
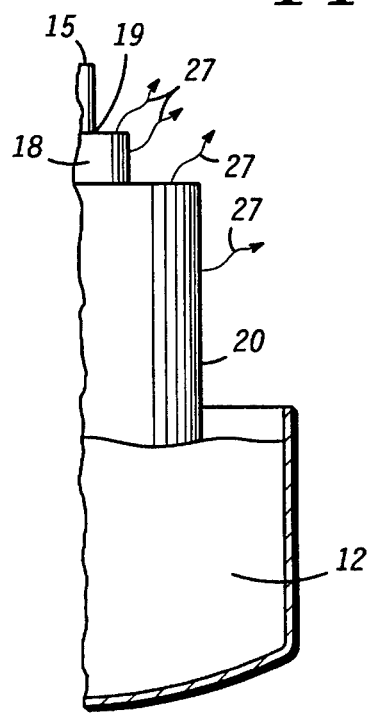
FIG. 4 is a schematic view of the heat dispersion of the ingot of FIG. 1.

Referring now to FIG. 4, with the addition of second neck 18 between thin neck 15 and elongated body 20, additional surface area for heat dissipation (represented by arrows 27) is provided. FIG. 4 only shows half of elongated body 20. Thus, junction 19 between thin neck 15 and second neck 18 has a substantially lower temperature than without second neck 18, thereby increasing the yield strength of junction 19.

As an example, with reference to FIG. 5, during the growth of a 300 mm diameter ingot, when the elongated body is 100 mm long, the weight is approximately 18 Kg. If second neck 18 is grown 25 mm in diameter and 75 mm long after thin neck 15, the temperature at junction 19 between thin neck 15 and second neck 18 is about 800° C. At this temperature, the yield strength of thin neck 15 at junction 19 will be approximately 40 Mpa. This is a sufficiently high yield strength to prevent any dislocation from being formed in thin neck 15 to propagate into elongated body 20. Second neck 18 will have a higher temperature of about 1000 degrees C., but also has a corresponding larger diameter of 25 mm, which can withstand approximately 500 Kg. During the crystal growth process, the length and weight increase, and the temperature at the end of thin neck 15, at junction 19, decreases. Therefore, there is a critical length and a critical diameter of elongated body 20 above which thin neck 15 is insufficient and cannot produce a zero dislocation crystal.

FIG. 6 illustrates the reduction in temperature at junction 19 for second neck 18 having a diameter of 25 mm, compared to a conventional ingot without a second neck. Curve 28 represents a conventional ingot without a second neck, having a diameter of 200 mm, 250 mm, and 300 mm, respectively. As can be seen, the temperature at junction 24 increases from approximately 990° C. to 1010° C. as the diameter increases. Curves 29, 30, and 32 illustrate ingots grown with a second neck having a 25 mm, 50 mm, and 75 mm height, respectively. As can be seen, growing a second neck substantially reduces the temperature of the thin neck, with a junction between the thin neck and the second neck being anywhere from 60° C. to 110° C. lower than the junction of the conventional ingot. Thus, larger diameter dislocation free ingots of single crystal semiconductor material can be grown.

Figure 7:
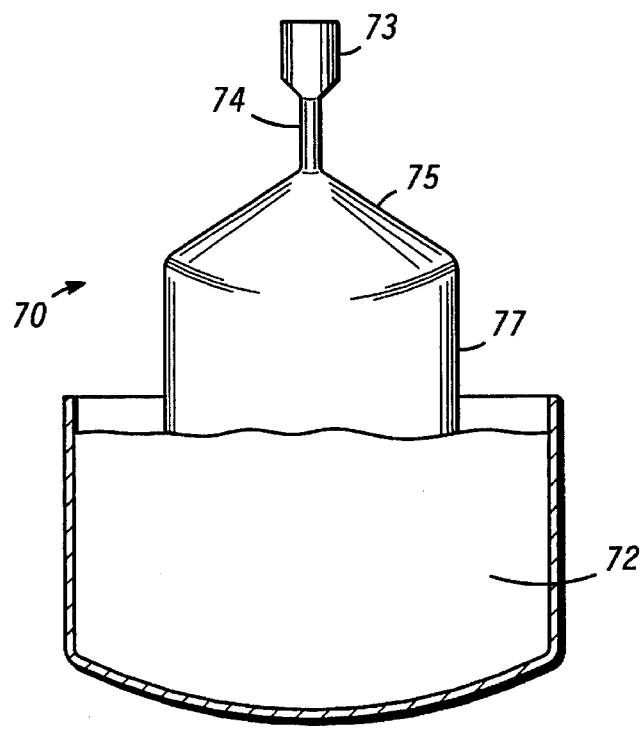
FIG. 7 is an elevational view of another embodiment of the present invention.

Referring specifically to FIG. 7, another ingot 70 of semiconductor material embodying the present invention is illustrated. To form ingot 70 a melt 72 of semiconductor material is provided as previously described. A single crystal seed 73 of the semiconductor material is inserted into melt 72 of the semiconductor material and seed 73 is pulled at a first rate to gradually grow an elongated, single crystal thin neck 74 of the semiconductor material having a diameter of approximately 3 mm to 6 mm to obtain zero dislocations in the single crystal semiconductor material. The pulling rate of elongated thin neck 74 is gradually altered to a second rate, slower than the first rate, to grow a shoulder 75 on thin neck 74 in the range of approximately 25 mm to 75 mm long. The length of shoulder 75 and the increase in diameter is selected to reduce the heat at the junction sufficiently to increase the yield strength of thin neck 74 so that a body of a desired size can be grown. The elongated thin neck 74 and the shoulder 75 are continuously pulled at the second rate to grow a single crystal elongated body 77 of the semiconductor material with a diameter of at least 200 mm.

Figure 8:
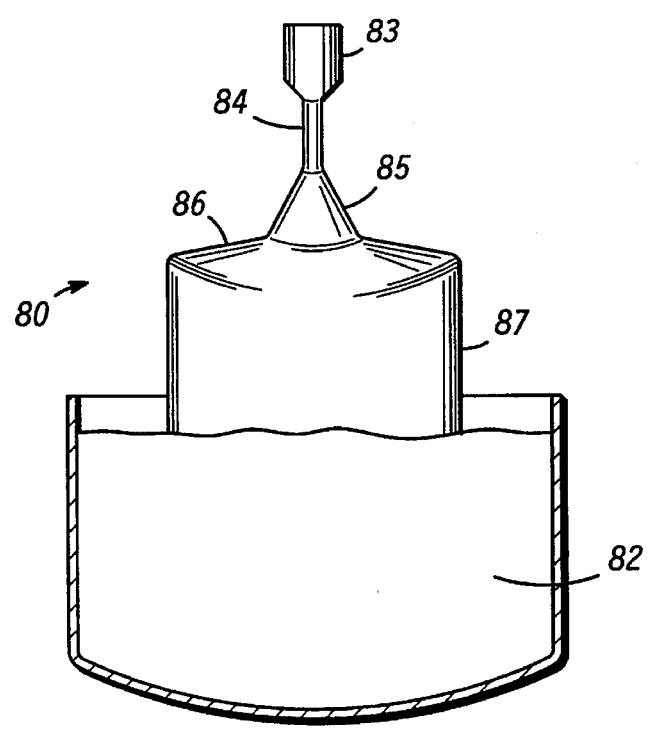
FIG. 8 is an elevational view of a further embodiment of the present invention.

Referring specifically to FIG. 8, another ingot 80 of semiconductor material embodying the present invention is illustrated. To form ingot 80, a melt 82 of semiconductor material is provided as previously described. A single crystal seed 83 of the semiconductor material is inserted into melt 82 of the semiconductor material and seed 83 is pulled at a first rate to gradually grow an elongated, single crystal thin neck 84 of the semiconductor material having a diameter of approximately 3 mm to 6 mm to obtain zero dislocations in the single crystal semiconductor material. The pulling rate of elongated thin neck 84 is continuously reduced to a second rate, slower than the first rate, to form a second neck 85 With a diameter greater than thin neck 84. The step of altering the pulling rate of thin neck 84 to a second rate includes continuously decreasing the second rate to produce second neck 85 with a continuously increasing diameter in the range of approximately 3 mm to 50 mm and approximately 25 mm to 75 mm long. The pulling rate of thin neck 84 and second neck 85 is then altered to a third rate, slower than the second rate, to grow a shoulder 86 on second neck 85. Finally, the pulling rate of thin neck 84, second neck 85, and shoulder 86 is altered to a fourth rate, faster than the third rate to grow a single crystal elongated body 87 of the semiconductor material.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A semiconductor crystal growth method comprising the steps of:
   providing a melt of a semiconductor material;
   inserting a single crystal seed of the semiconductor material into the melt of the semiconductor material;
   forming a single crystal ingot of the semiconductor material having a first neck, a second neck, and an elongated body, the second neck having a diameter larger than the first neck and less than the elongated body.

2. A method as claimed in claim 1 wherein the step of providing the melt includes providing a melt of polycrystalline semiconductor material.

3. A method as claimed in claim 1 wherein the step of forming the single crystal ingot includes the steps of:
   pulling the single crystal seed at a first pulling rate to gradually grow an elongated, single crystal first neck of the semiconductor material;
   altering the first pulling rate to a second pulling rate, slower than the first pulling rate, to form a first shoulder on the elongated, single crystal first neck, the first shoulder having a first diameter greater than the elongated, single crystal first neck;
   altering the second pulling rate to a third pulling rate faster than the second pulling rate and slower than the first pulling rate to form a second neck on the first shoulder with a second diameter approximately equal to the first diameter;
   altering the third pulling rate to a fourth pulling rate, slower than the third pulling rate to form a second shoulder on the second neck, the second shoulder having a third diameter greater than the second neck; and
   altering the fourth pulling rate to a fifth pulling rate initially faster than the fourth pulling rate to form the single crystal ingot of the semiconductor material on the second shoulder.

4. A method as claimed in claim 3 wherein the step of pulling the single crystal seed is done at a first pulling rate such that the first neck has a diameter of approximately 3 mm to 6 mm to obtain zero dislocations in the elongated, single crystal first neck.

5. A method as claimed in claim 3 wherein the step of pulling the single crystal seed is done at a third pulling rate such that the second neck has a diameter in a range of approximately 10 mm to 50 mm.

6. A method as claimed in claim 3 wherein the step of pulling the single crystal seed at the third pulling rate continues until the second neck is grown approximately 25 mm to 75 mm long.

7. A method as claimed in claim 3 wherein the step of pulling the single crystal seed at the first pulling rate includes pulling the single crystal seed at a first pulling rate in a range from 100 to 250 mm/hour, and wherein the step of altering the first pulling rate to the second pulling rate includes altering the first pulling rate to a second pulling rate in a range from 20 to 50 mm/hour, and wherein the step of altering the second pulling rate to the third pulling rate includes altering the second pulling rate to a third pulling rate in a range from 50 to 125 mm/hour.

8. A method as claimed in claim 1 wherein the step of forming the single crystal ingot includes the steps of:
   pulling the single crystal seed at a first rate to gradually grow an elongated, single crystal first neck of the semiconductor material;
   altering the first rate to a second rate, slower than the first rate to grow a second neck on the elongated, single crystal first neck;
   altering the second rate to a third rate, slower than the second rate to grow a first shoulder on the second neck; and
   altering the third rate to a fourth rate, faster than the third rate to grow a single crystal elongated body of the semiconductor material on the first shoulder.

9. A method as claimed in claim 8 wherein the step of altering the first rate to the second rate includes altering the second rate such that the second neck has a continuously increasing diameter.

10. A method as claimed in claim 9 wherein the step of altering the first rate to the second rate includes altering the second rate such that the second neck has a continuously increasing diameter in a range from approximately 3 mm to 50 mm.

11. A method of growing semiconductor crystals comprising the steps of:
   providing a melt of a semiconductor material;
   inserting a single crystal seed of the semiconductor material into the melt of the semiconductor material and pulling the single crystal seed at a first rate to gradually grow an elongated, single crystal first neck of the semiconductor material having a diameter of approximately 3 mm to 6 mm to obtain zero dislocations in the elongated, single crystal first neck;
   altering pulling rate of the elongated, single crystal first neck to a second rate, slower than the first rate, to grow a shoulder on the elongated, single crystal first neck with a diameter greater than the elongated, single crystal first neck;
   continuing to pull the elongated, single crystal first neck and the shoulder at the second rate to form a second neck with a diameter in a range of approximately 10 mm to 50 mm, and until the second neck is grown approximately 25 mm to 75 mm long; and
   altering pulling rate of the elongated, single crystal first neck and the second neck to a third rate, slower than the second rate, to grow a single crystal elongated body of the semiconductor material with a desired diameter greater than the second neck.

12. A method of growing semiconductor crystals as claimed in claim 11 wherein the step of altering the pulling rate of the elongated, single crystal first neck and the second neck includes altering the pulling rate to the third rate such that the single crystal elongated body has a diameter of at least 200 mm.

13. A method of growing semiconductor crystals comprising the steps of:

providing a melt of a semiconductor material;

inserting a single crystal seed of the semiconductor material into the melt of the semiconductor material and pulling the single crystal seed at a first rate to gradually grow an elongated, single crystal first neck of the semiconductor material having a diameter of approximately 3 mm to 6 mm to obtain zero dislocations;

gradually altering pulling rate of the elongated, single crystal first neck to a second rate, slower than the first rate, to grow a shoulder on the elongated, single crystal first neck in a range of approximately 25 mm to 75 mm long; and continuing to pull the elongated, single crystal first neck and the shoulder at the second rate to grow a single crystal elongated body of the semiconductor material with a diameter of at least 200 mm.

* * * * *